United States Patent [19]

Ong

[11] 4,386,420
[45] May 31, 1983

[54] DYNAMIC READ REFERENCE VOLTAGE GENERATOR

[75] Inventor: Warren R. Ong, Cupertino, Calif.

[73] Assignee: Fairchild Camera and Instrument Corp., Mountain View, Calif.

[21] Appl. No.: 313,001

[22] Filed: Oct. 19, 1981

[51] Int. Cl.³ .............................................. G11C 7/00
[52] U.S. Cl. .................................................... 365/208
[58] Field of Search ............... 365/191, 205, 207, 208, 365/209, 210

[56] References Cited

U.S. PATENT DOCUMENTS 4,301,518  11/1981  Klaas ................................... 365/207
4,313,177  1/1982  Heuber et al. ...................... 365/210

Primary Examiner—George G. Stellar
Attorney, Agent, or Firm—Kenneth Olsen; Theodore Scott Park; Michael J. Pollock

[57] ABSTRACT

A method and circuitry (5) for enhancing the reproducibility and reliability of circuitry for reading a memory array (10a, 10b, 10a', 10b') provides a dynamically generated reference voltage for the sensing circuitry. The invention senses the highest word line voltage and communicates a voltage derived therefrom to the sensing circuitry (26, 27, 28, 29; 26', 27', 28', 29'; 32, 33) to provide a reference voltage. A voltage clamp (62) is coupled to the circuitry for communicating the highest word line voltage (50) to prevent the reference voltge from following the word line too low during transitions. The invention is rendered compatible with the existing write circuitry associated with the memory array (10a, 10b, 10a', 10b') by the provision of disabling circuitry (65) coupled to the communicating circuitry (55, 57) and to the clamp (62). The disabling circuitry (65) is responsive to a write control signal and operates to prevent the high word line voltage from being communicated to the sensing circuitry, and further operates to allow the communication of lower voltage than would normally be permitted by the clamp (62).

21 Claims, 4 Drawing Figures

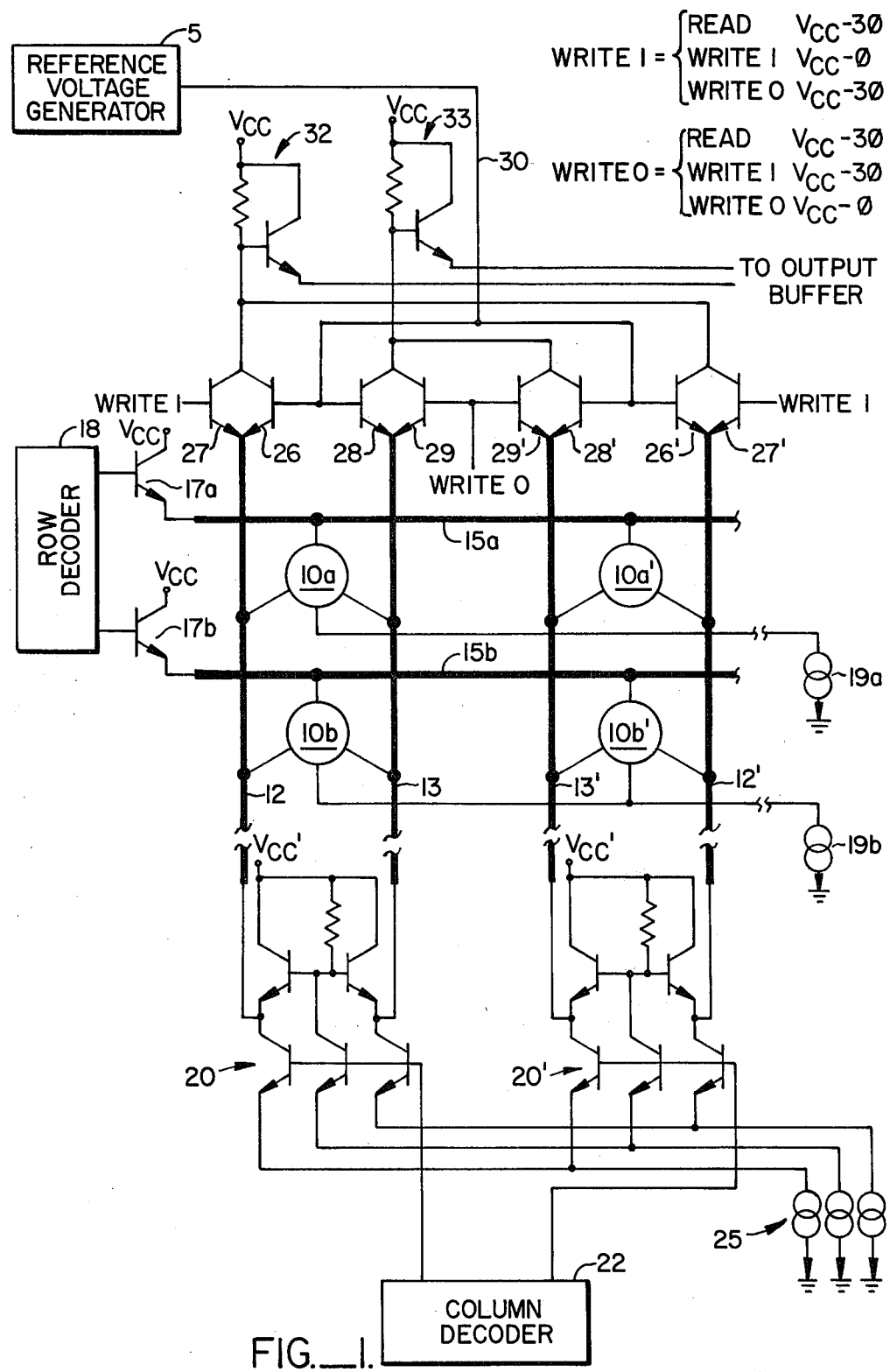
FIG._1.

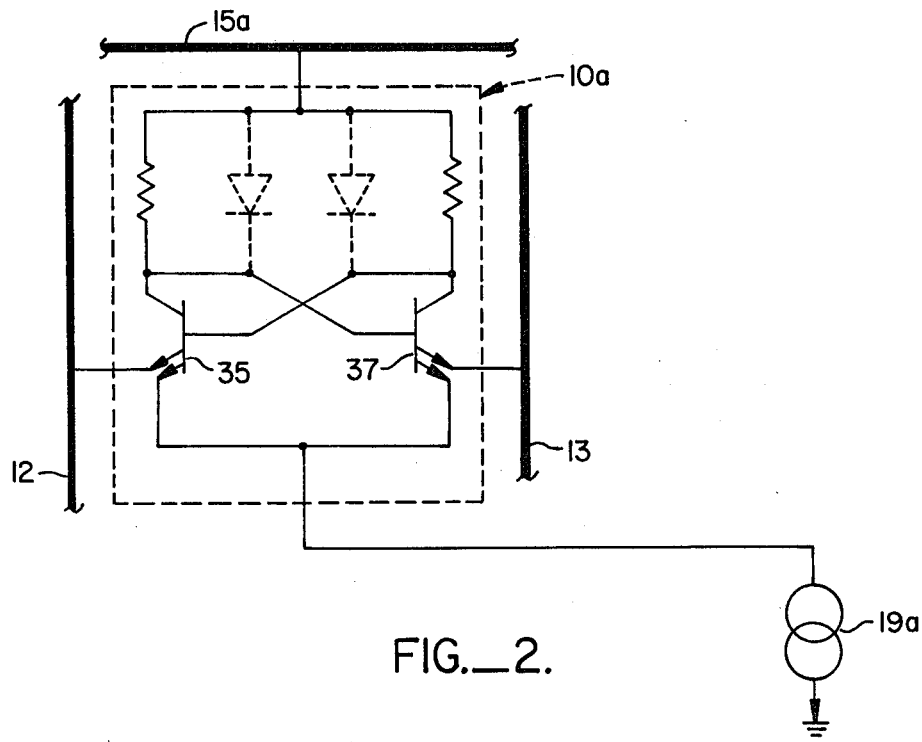
FIG._2.
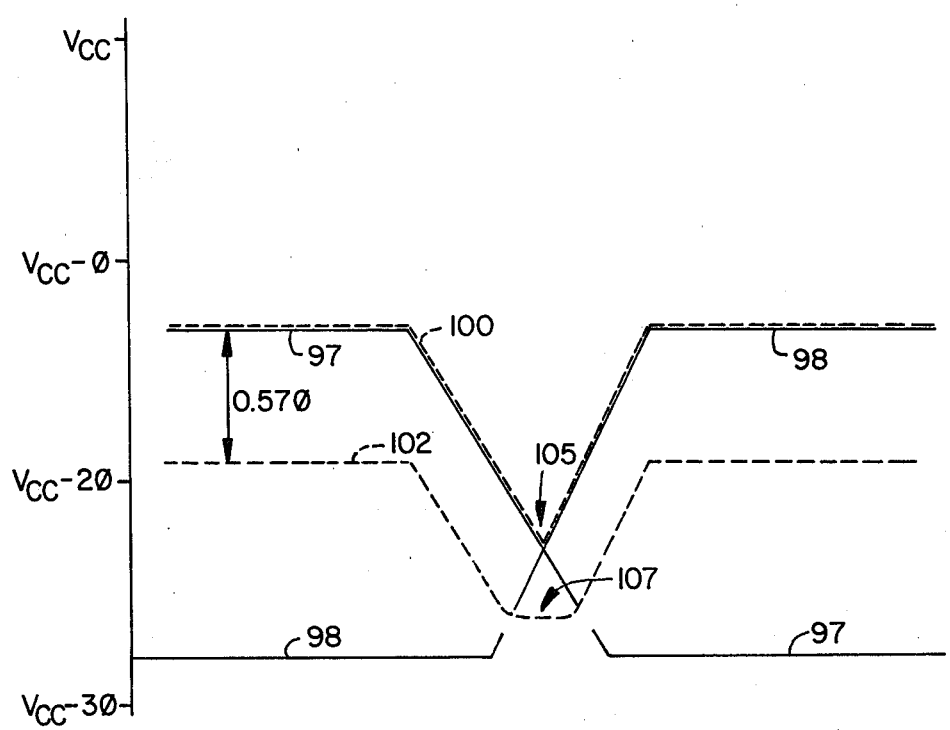
FIG._4.

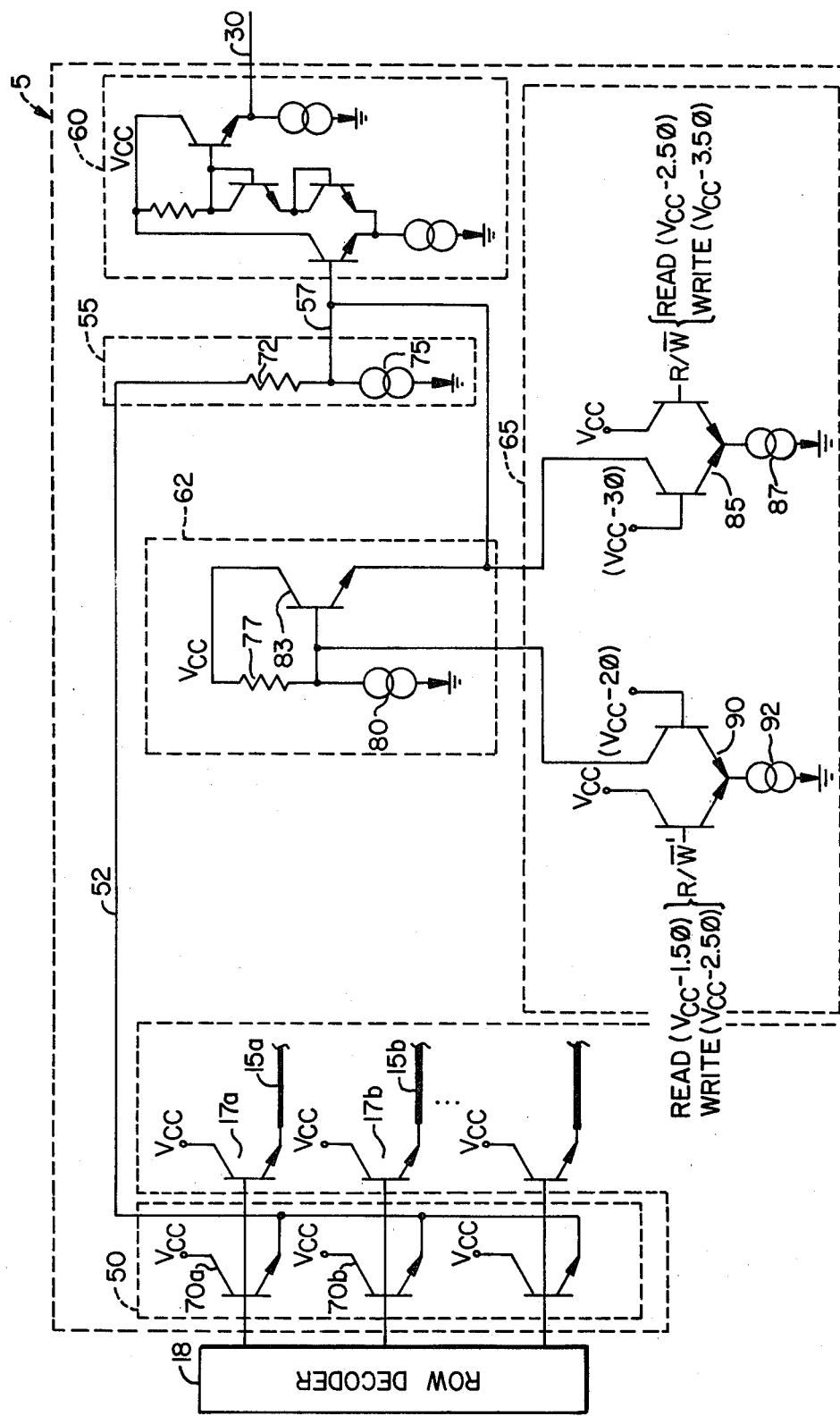
FIG._3.

DYNAMIC READ REFERENCE VOLTAGE GENERATOR

FIELD OF THE INVENTION

The invention relates generally to memory control circuitry and more specifically to an improvement in the circuitry for reading the contents of memory cells.

BACKGROUND OF THE INVENTION

A solid state memory array in which the memory cells are arranged in rows and columns is provided with a word line for each row and one or more bit line(s) for each column. Each word line is common to all the memory cells within its given row, and the bit line(s) for each column is (are) common to all memory cells in that column. The operation of reading the contents of a selected memory cell comprises the steps of applying a voltage signal to the word line corresponding to the row containing the line selected memory cell, and sensing a voltage change on the bit line(s) for the column containing the selected memory cell. The bit line(s) is (are) coupled to sense amplification circuitry in order to generate usable signals.

It is known in the prior art to provide a reference voltage for the sensing circuitry, which reference voltage is generated by a voltage offset from the highest supply line. However, in a large memory array the word lines are physically distributed over a relatively large area, and thus the applied word line voltages for the different rows of memory cells exhibit an unavoidable degree of variation. Process variations also manifest themselves in a somewhat poorly controlled reference voltage. The result is an inevitable mismatch between the read reference voltage and at least some of the high word line voltages, with consequential reduced noise margins and reduced stability. Put another way, from the point of view of given memory cell, the reference voltage will appear different, thus leading to pattern sensitive operation. Other process variations could cause additional mismatching between the read reference voltage and the high word line voltage which would result in even less stability and more pattern sensitivity. Moreover, while any noise on the high supply line is translated to the read reference voltage, the parasitic loading on the word lines are drastically different so that the noise is not necessarily translated to the word lines. Disturbances of the memory cells and limitations in the range of operations have been attributed to such noise.

Thus, there is presented the need for increased reliability in the reading of large memory arrays to enable the use of such arrays under a wide variety of conditions.

SUMMARY OF THE INVENTION

The present invention provides a method and circuitry for enhancing the reproducibility and reliability of the memory read circuitry by rendering it less sensitive to process variations, internal ground drops, supply voltage noise, and minor defects in the word decoder and word line drivers.

Broadly, the present invention achieves the results by utilizing a dynamically generated voltage in the sensing circuitry. More particularly, the present invention senses the highest word line voltage and communicates a voltage derived from the highest word line voltage to the sensing circuitry as a reference voltage. Thus, the circuitry comprises means for sensing the highest word line voltage and means for communicating a voltage derived therefrom to the sensing circuitry to provide a reference voltage.

According to a further aspect of the present invention, a voltage clamp is coupled to the circuitry for communicating the highest word line voltage to prevent the reference voltage from following the word line too low during transitions.

According to yet a further aspect of the present invention, the circuitry of the present invention is rendered compatible with the existing write circuitry associated with the memory array by the provision of disabling circuitry coupled to the communicating circuitry and to the clamp. The disabling circuitry is responsive to a write control signal and operates to prevent the high word line voltage from being communicated to the sensing circuitry, and further operates to allow the communication of lower voltage than would normally be permitted by the clamp. Thus, the memory cells are able to properly respond to the write signals.

It will be appreciated that since the bit line voltage to be sent is itself controlled by the word line voltage, the use of a dynamically generated voltage derived from the word line voltage immunizes the sensing circuitry from problems of noise and process variability.

Another important advantage of the present invention is an improved ability to read a newly selected memory cell. While the data of a newly selected cell, as selected through the word line, cannot be sensed until the high base node of the cell exceeds the voltage of the read level, the dip in the read reference voltage that occurs as word lines are switched allows the newly selected cell to be sensed sooner than if a fixed reference voltage were used.

For a further understanding of the nature and advantages of the present invention, reference should be made to the remaining parts of the specification and to the attached drawings.

BRIEF DESCRIPTION OF THE DRAWINGS

FIG. 1 is a circuit schematic of control circuitry for a portion of a memory cell array;

FIG. 2 is a circuit schematic of a typical memory cell;

FIG. 3 is a circuit schematic of the present invention as applied to a memory cell array; and FIG. 4 is a graphical representation of the word line and reference voltages during a transition.

DETAILED DESCRIPTION OF THE INVENTION

FIG. 1 is a schematic view showing a read reference voltage generator 5 (drawn in block diagram form) used in connection with the circuitry for controlling read access to an array of memory cells 10, typically on an integrated circuit chip. The array includes rows and columns with two rows and two columns being shown. In order to facilitate description, the rows will be differentiated by an alphabetic designator and the columns by a prime. Thus, the first row includes cells 10a and 10a', and the second row includes cells 10b and 10b'. Each column has an associated pair of bit lines, designated 12 and 13 for the first column, 12' and 13' for the second column. Each row has an associated word line, designated 15a for the first row, and 15b the second row. Word lines 15a and 15b are driven by respective emitter followers 17a and 17b, the bases of which are controlled by respective output signals from a row decoder 18. Further associated with the rows are respective standby memory bias current sources 19a and 19b. The columns have respective associated biasing networks 20 and 20', each of which is coupled to the bit lines of its associated column and is controlled by a respective output signal from a column decoder 22 which selectively couples one of the biasing networks to a set of current sources 25.

Sensing circuitry for the first column includes a first parallel pair of transistors 26 and 27 having their emitters coupled to bit line 12 and a second parallel pair of transistors 28 and 29 having their emitters coupled to bit line 13. The bases of transistors 26 and 28 are held at a voltage generated by read reference voltage generator 5 as communicated on a line 30. (In prior art systems, the bases are held at a static voltage offset from the high supply line $V_{cc}$. The present invention is drawn to a dynamic reference voltage generator to be described below.) The bases of transistors 27 and 29 are controlled by respective write signals, designated WRITE1 and WRITE0, to be described below. The collectors of transistors 26 and 27 are coupled to a first sense amplifier 32 while the collectors of transistors 28 and 29 are coupled to a second sense amplifier 33. Sensing circuitry for the second column includes corresponding transistors 26', 27', 28' and 29'. Sense amplifiers 32 and 33 are common to both columns.

FIG. 2 is a circuit schematic illustrating a typical configuration for memory cell 10a, it being understood that the other cells are substantially identical. The precise configuration of the memory cells forms no part of the present invention, and will not be described in great detail. The cell includes two transistors 35 and 37 whose relative states of conduction define the cell content. As is well known, for the cell configuration shown, reading a cell is effected by steering current sources 25 to the appropriate bit lines and applying a positive pulse to the appropriate word line. This uniquely selects the cell to be read, and a voltage pulse appears on one of the bit lines, as determined by which of transistors 35 and 37 in the cell is conducting.

More particularly, when transistor 35 is on, its base is approximately 0.13*Φ below the word line voltage while the base of transistor 37 (which is off) is Φ below the word line voltage. (Φ is the voltage drop across a forward-biased base-emitter junction and is approximately 0.76 volts). Word line 15a is nominally held at $(V_{cc}-2.8*\Phi)$ when not selected, and is raised to $(V_{cc}-1.3*\Phi)$ when selected. During writing, the reference voltage on line 30 is held low (as will be described below), and one of the WRITE0 and WRITE1 lines is raised to $(V_{cc}-\Phi)$ in order to establish (or leave intact) the desired state of the cell.

FIG. 3 is a circuit schematic illustrating dynamic read reference voltage generator 5. In its broadest aspect, generator 5 provides a voltage on line 30 that bears a constant known relationship to the highest word line voltage, and to this end includes circuitry 50 for providing a voltage representative of the maximum voltage on all of the word lines. This voltage is communicated on a line 52 to offsetting circuitry 55, the offset output of which is communicated on a line 57 to voltage follower circuitry 60 having an output coupled to line 30. Line 57 is further operatively coupled to voltage clamping circuitry 62 which prevents the voltage from tracking too low. In order for generator 5 to operate in conjunction with normal write circuitry, there is also provided override circuitry 65 to disable to dynamic read reference voltage generator during writing operations. The precise circuitry to accomplish these functions will now be described.

Circuitry 50 comprises a plurality of transistors 70a, 70b, etc., corresponding to word lines 15a, 15b, etc., the bases of which are controlled by the same output signals that drive emitter followers 17a, 17b, etc. The emitters of transistors 70a, 70b, etc. are tied together to line 52. Offset circuitry 55 includes a resistor 72 and a constant current source 75 which is always on to provide a fixed offset of 0.57*Φ on line 57. Voltage follower circuitry 60 is standard and will not be described further.

Clamping circuitry 62 includes a resistor 77 and a current source 80 that holds the base node 82 of a transistor 83 at approximately $(V_{cc}-1.6*\Phi)$. The emitter of transistor 83 is coupled to line 57 to prevent the voltage on line 57 from falling below approximately $(V_{cc}-2.6*\Phi)$.

Override circuitry 65 has the function of maintaining line 57 (and hence line 30) at a low level during writing. To this end, there are provided first and second pull-downs for line 57 and clamping circuitry 62, respectively. The first pull-down comprises a current steering network 85 and a current source 87. Steering is controlled by a first control signal, designated R/$\overline{W}$, which, when low, causes extra current from source 87 to be drawn through resistor 72 in offsetting circuitry 55, thus lowering the voltage on line 57. However, clamping circuitry 62 would operate to limit the downward voltage excursion on line 57 were it not for the second pull-down which comprises a current steering network 90 and a current source 92. Steering is controlled by a second control signal, designated R/$\overline{W}'$, which, when low, causes extra current from source 92 to be drawn through resistor 77, thus, in effect, disabling clamping circuitry 62.

The operation of the present invention may now be understood. FIG. 4 is a graphical, somewhat schematic plot of voltage versus time over an interval during which the selected word line changes. The voltage plot for a first word line is designated by reference numeral 97, that of a second by reference numeral 98. The figure shows the circumstance wherein the first word line is initially selected, and then the second word line is selected. The plot of the voltage on line 52 that communicates from the emitter tied node within circuitry 50 is shown in phantom and designated by reference numeral 100. The plot for the voltage on line 57 (and line 30) is also shown in phantom and designated by reference numeral 102. As can be seen, the voltage from circuitry 50 is characterized by a dip 105 as the word lines are switched. The depth of dip 105 depends on the relative timing of the rise of the second word line and the fall of the first. The figure illustrates a situation where the dip is about ⅔ the separation of the active and inactive word line levels. However, the effect of clamping circuitry 62 is to prevent the dip on line 57 from exceeding about ½ the separation. This results in voltage plot 102 having a flat-bottomed dip 107. It should be noted that the data in a newly selected cell (as selected through the word line) cannot be sensed until the high base node of the cell (which is offset from the word line) exceeds the read reference level. Dip 107 thus allows the newly selected cell to be sensed sooner.

While FIG. 4 shows the selected word line voltages as having the same nominal high value, it will be appreciated that process variations and the like typically lead to differences in the word line voltage for different selected word lines. However, the emitter tied node within circuitry 50 tracks the high word line voltage, regardless of possible process variations. Therefore, the read reference voltage at the base of the sensing transistors (e.g., 26 and 28) within the selected column bears a known relationship to the word line voltage, and hence the high base node within the cell, whereupon reading reliability is significantly enhanced.

While the above represents a full and complete disclosure of the preferred embodiment of the invention, various modifications alternate constructions, and equivalents may be employed without departing from the true spirit and scope of the invention. For example, the particular clamping circuitry and override circuitry represent a convenient, but by no means unique way of accomplishing the stated functions. Additionally, it will be appreciated that the memory array is often organized in blocks with additional block select circuitry, but the present invention is suitable for other arrangements as well. Moreover, while voltage levels appropriate for a particular design of memory cell and array are disclosed, they are merely illustrative. Therefore, the above description and illustrations should not be construed as limiting the scope of the invention which is defined by the appended claims.

I claim:

1. In circuitry for reading the contents of a selected memory cell within a column of memory cells, each said memory cell having an associated word line, said memory cells having a common bit line with associated sensing circuitry, selection of a given memory cell occurring by the provision of an active level on the word line corresponding to said given memory cell, the improvement comprising:

means operatively coupled to said word lines for providing a voltage representative of the most active voltage on said word lines; and means for communicating a voltage derived from said most active voltage to said sensing circuitry to provide a reference voltage therefor.

2. The invention of claim 1, and further comprising: clamping means coupled to said communicating means for preventing said reference voltage from assuming a level removed from an active level by more than a predetermined amount, regardless of the voltages on said word lines.

3. The invention of claim 1, and further comprising: means operatively coupled to said communicating means for disabling said communicating means in response to a write signal to permit writing into one of said memory cells.

4. The invention of claim 1 wherein said active level is approximately 1.5 diode drops above the inactive level.

5. The invention of claim 1 wherein said providing means comprises a plurality of transistors corresponding to said plurality of word lines, each said transistor having its base tied to a level representative of the level on the corresponding word line, said plurality of transistors having their respective emitters tied together to provide said most active voltage.

6. The invention of claim 1 wherein said communicating means comprises:

offsetting means for providing a voltage offset from said most active voltage; and voltage follower means having an input to which said voltage offset from said most active voltage is communicated.

7. The invention of claim 6 wherein said clamping means is coupled to said voltage follower input to prevent voltage swings of more than a predetermined amplitude.

8. The invention of claim 7 wherein said disabling means comprises means for maintaining a non-active voltage at said voltage follower input.

9. The invention of claim 1 wherein said bit line is coupled to said memory cells to permit writing to occur to a selected memory cell by the application of a signal to said bit line.

10. In circuitry for reading the contents of a selected memory cell within an array of memory cells having a plurality of rows, each row of cells having an associated word line and each column of cells having a bit line with associated sensing circuitry, a voltage generator for providing a reference voltage for said sensing circuitry comprising:

means operatively coupled to the plurality of word lines corresponding to said plurality of rows for providing a voltage representative of the maximum voltage on said word lines; and means for communicating a voltage derived from said maximum voltage to said sensing circuitry to provide a reference voltage therefor.

11. The invention of claim 10, and further comprising clamping means coupled to said communicating means for preventing said reference voltage from falling below a predetermined value, regardless of the voltages on said word lines.

12. The invention of claim 10, and further comprising means for disabling said communicating means in response to a write signal to permit writing into a selected one of said memory cells.

13. The invention of claim 10 wherein said communicating means includes means operatively coupled to said providing means for offsetting said maximum voltage by a predetermined amount.

14. In circuitry for reading the contents of a selected memory cell within a column of memory cells, each said memory cell having an associated word line, said memory cells having a common bit line with associated sensing circuitry, selection of a given memory cell occurring by the provision of an active level on the word line corresponding to said given memory cell, the improvement comprising:

means operatively coupled to said word lines for providing a voltage representative of the most active voltage on said word lines;

means for communicating a voltage derived from said most active voltage to said sensing circuitry to provide a reference voltage therefor;

clamping means coupled to said communicating means for preventing said reference voltage from assuming a level removed from an active level by more than a predetermined amount, regardless of the voltages on said word lines; and means operatively coupled to said communicating means for disabling said communicating means in response to a write signal to permit writing into one of said memory cells.

15. The invention of claim 14 wherein said providing means comprises a plurality of transistors corresponding to said plurality of word lines, each said transistor having its base tied to a level representative of the level on the corresponding word line, said plurality of transistors having their respective emitters tied together to provide said most active voltage.

16. The invention of claim 14 wherein said communicating means comprises:
   offsetting means for providing a voltage offset from said most active voltage; and
   voltage follower means having an input to which said voltage offset from said most active voltage is communicated.

17. The invention of claim 16 wherein said clamping means is coupled to said voltage follower input to prevent voltage swings of more than a predetermined amplitude.

18. The invention of claim 16 wherein said disabling means comprises means for maintaining a non-active voltage at said voltage follower input.

19. The invention of claim 14 wherein said active level is approximately 1.5 diode drops above the inactive level.

20. A method of reading the contents of a selected memory cell within a column of memory cells having a common bit line with associated sensing circuitry, each cell in the column having an associated word line for selection of a given memory cell by the provision of an active level on the given cell's corresponding word line, comprising the steps of:
   sensing the voltages on all of the word lines;
   providing a voltage representative of the most active of the voltages of the word lines;
   communicating a voltage directly representative of the most active voltage to the sensing circuitry to provide a reference voltage therefor.

21. The invention of claim 20, and further comprising the step of limiting said communicating step to prevent the communicated voltage from deviating from an active level by more than a predetermined amount.

* * * * *